United States Patent [19]
Davis et al.

[11] Patent Number: 4,876,579
[45] Date of Patent: Oct. 24, 1989

[54] LOW TOP GATE RESISTANCE JFET STRUCTURE

[75] Inventors: Christopher K. Davis, Merritt Island; James D. Beasom, Melbourne Village, both of Fla.

[73] Assignee: Harris Corporation, Melbourne, Fla.

[21] Appl. No.: 301,835

[22] Filed: Jan. 26, 1989

[51] Int. Cl.4 .............................................. H01L 29/80
[52] U.S. Cl. ........................................ 357/22; 357/20
[58] Field of Search ................. 357/22 R, 22 F, 22 G, 357/20, 43

[56] References Cited

U.S. PATENT DOCUMENTS

| | | | |
|---|---|---|---|
| 3,223,904 | 12/1965 | Warner, Jr. et al. | 357/22 |
| 3,649,385 | 3/1972 | Kobayashi | 148/186 |
| 4,143,392 | 3/1979 | Mylroie | 357/43 |
| 4,176,368 | 11/1979 | Compton | 357/22 |
| 4,187,514 | 2/1980 | Tomisawa et al. | 357/22 |
| 4,322,738 | 3/1982 | Bell et al. | 357/22 |
| 4,456,918 | 6/1984 | Beasom | 357/22 |
| 4,495,694 | 1/1985 | Beasom | 29/571 |

Primary Examiner—Andrew J. James
Assistant Examiner—Mark Prenty
Attorney, Agent, or Firm—Barnes & Thornburg

[57] ABSTRACT

A JFET having top gate contact regions formed in either one or both of the source and drain regions at and contacting a substantial portion of the edge terminations of the top gate in the source and drain regions. The improved top gate contact region can be used in three and four terminal JFET's.

13 Claims, 2 Drawing Sheets

LOW TOP GATE RESISTANCE JFET STRUCTURE

BACKGROUND AND SUMMARY OF THE INVENTION

The present invention relates generally to junction field effect transistors and, more specifically, to an improved thin channel junction field effect transistor.

Junction field effect transistors (JFET) have been used as active devices for many years. More recently, a JFET structure which is compatible with bipolar processing known as a BIFET has been developed. Parallel source and drain regions are formed in a bottom gate region during the base diffusion of the bipolar processing. A common ohmic contact region to the bottom gate region and the to-be-formed top gate region are formed during the emitter diffusion of the bipolar devices. The additional BFET processing steps are ion implantations of a channel region between the source and drain regions and buried below the surface followed by an ion implantation of the top gate region. Since in most applications, the top and bottom gates are connected together, a single ohmic contact to the bottom and the thin top gate regions is made in the bottom gate. Also, the top gate extends outside the channel region and makes direct contact with the bottom gate. Such a prior art device is illustrated in FIG. 1.

The P implant which forms a channel region is about 0.3 microns thick and about 0.3 microns below silicon surface. The two P diffusion contacts which form the source and drain along the two edges provide a path from the channel implant up to the top surface wherein interconnects can be made. The N implant forms the top gate and is very shallow, typically about 0.3 microns, into the top surface. The N top gate implant is lower in impurity concentration than the surface of the P source and drain diffusion and, consequently, aluminum cannot make an ohmic contact thereto. Also, the top gate is so shallow that aluminum will migrate through it to form a short to the channel region if direct contact were made. To avoid these problems, the gate implant is extended and overlaps the N+ contact diffusion at the end of the channel.

U.S. Pat. No. 4,176,368 shows the use of a cap of low impurity concentration extending over the thin channel region and a higher impurity concentration top gate extending into the channel below the cap and laterally beyond the channel to contact the bottom gate. The top gate provides a more pronounced gate action and enhanced channel pinch off.

In many applications, it is desirable to isolate the top gate from the bottom gate so they can be connected to separate terminals. This is particularly desirable when gate leakage or AC performance is important. In both cases, the presence of isolation region parasitics on the bottom gate make it desirable to disconnect the bottom gate from the signal input or top gate. Another advantage afforded by an isolated gate structure is that several devices can be built in a common bottom gate isolated island rather than in separate isolated islands. This saves die area and improves match of matched pairs by allowing the members of the pair to be closer to one another.

The basic method used in the prior art to isolate top and bottom gates is to form the top gate as a closed geometry surrounding either the source or drain and the top gate surrounded by the other terminal. The choice of a closed geometry provides termination of gate region across the source and drain contact regions along the entire parameter of the gate. This assures that there is no contact between top and bottom gates along their edge. An example of such a closed geometry JFET is illustrated in U.S. Pat. No. 3,649,385.

An isolated gate JFET structure and method of fabrication for thin channel JFETs is shown in U.S. Pat. Nos. 4,456,918 and 4,495,694 to Beasom. Contacts are made to the top gate region using a deep contact area received in a deep isolation region having the same impurity concentration as the channel and extending down into the bottom gate. Although providing a top isolated gate with appropriate contact, the Beasom patents produce a high top gate resistance when applied to large geometry devices since the contact is displaced from the width of the channel regions. The ion implantation process which produces the top gate results in high sheet resistance. The higher the gate resistance, the higher the noise and the lower the frequency response.

Thus, it is an object of the present invention to provide an isolated top gate junction field effect transistor having reduced top gate resistance.

Another object of the present invention is to provide a thin channel isolated top gate JFET having reduced top gate resistance.

A still even further object of the present invention is to provide an isolated top gate JFET with improved noise reduction and frequency response.

An even further object of the present invention is to provide a JFET with reduced top gate resistance.

These and other objects are attained by having the thin top gate and channel region formed in a bottom gate region extending between source and drain regions, and providing a top gate contact region having a lower resistance than the top gate region in one or both of the source and drain regions and contacting a substantial portion of the edge termination of the top gate region in the source and drain regions. The top gate contact region extends to a depth below the channel region. The source and drain regions have a sufficient depth to isolate the top gate and top gate contact regions from the bottom gate region. A concentric source and drain region which encompasses the top gate and channel regions includes a concentric region contact region in the concentric region, spaced from and laterally encompassing the top gate contact region therein. A bottom gate contact region is in the bottom gate exterior the concentric source and drain region. The encompassed source and drain region also includes an encompassed contact region. The top gate contact region may extend laterally into the bottom gate.

Other objects, advantages and novel features of the present invention will become apparent from the following detailed description of the invention when considered in conjunction with the accompanying drawings.

DETAILED DESCRIPTION OF THE DRAWINGS

Figure 1:
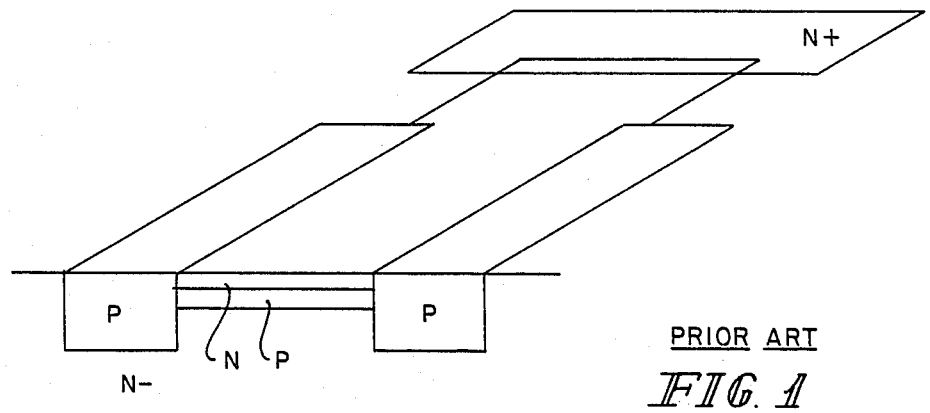
FIG. 1 is a perspective cross-sectional view of a BIFET structure of the prior art.
Figure 2:
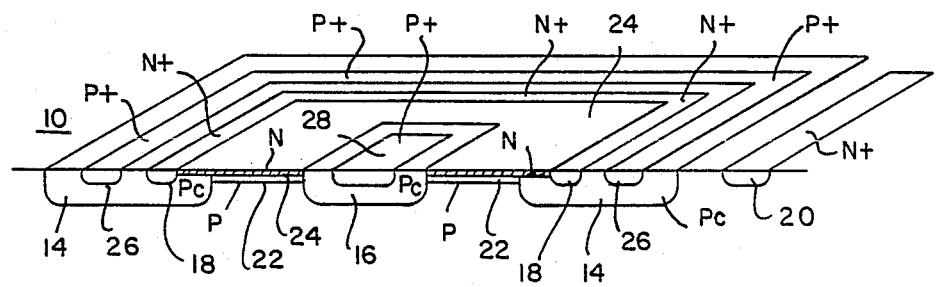
FIG. 2 is a perspective cross-sectional view of an isolated topgate JFET in accordance with the principles of the present invention.
Figure 3:
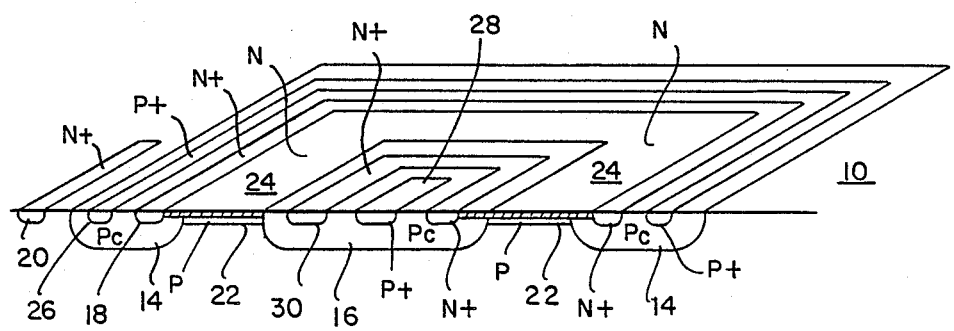
FIG. 3 is a perspective cross-sectional view of another embodiment of a JFET according to the principles of the present invention.
Figure 4:
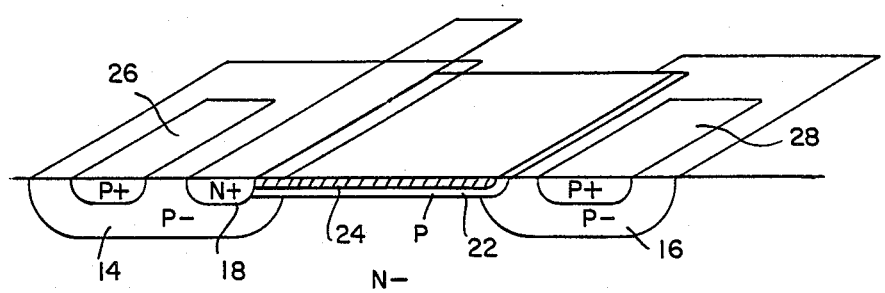
FIG. 4 is a perspective cross-sectional view of a connected top and bottom gate JFET according to the principles of the present invention.

Improved thin channel junction field effect transistors of the present invention are illustrated in FIGS. 2, 3 and 4 without the top insulative layer and metal contacts. The bottom gate of the JFET is an N− region 10 which may be a dielectrically isolated region or an epitaxial junction isolated region. The impurity concentration of the bottom gate 10 may be in the range of $1 \times 10^{14}$ to $1 \times 10^{17}$. The thin channel JFET of the present invention is compatible with and may be formed using bipolar processing techniques and, thus, is considered a BIFET.

The source and drain regions 14 and 16 are formed by introducing impurities opposite that of the bottom gate or in this example P type impurities into the bottom gate region 10. In order to achieve an isolated top and bottom gate or four terminal device of FIGS. 2 and 3, the source and drain region 14 is formed as an annulus or closed geometry. The source and drain 16 is formed interior to the source and drain 14. Thus, source and drain region 14 would be a concentric source and drain region laterally encompassing encompassed source and drain region 16. For the three terminal device having top gate connected to the bottom gate devices, illustrated in FIG. 4, the source and drain regions 14 and 16 do not encompasses one another.

The source and drain regions 14 and 16 may be formed simultaneously with forming the collector of a PNP, a low concentration NPN base region, a low concentration I²L base or a specific diffusion designed for isolation functions. The surface impurity concentration of the resulting source and drain regions should be in the range of $5 \times 10^5$ to $5 \times 10^{17}$. Alternatively, they may be formed simultaneously with the formation of bases of NPN bipolar transistors and have a surface impurity region in the range of $5 \times 10^{17}$ to $5 \times 10^{18}$. The source and drain regions 14 and 16 have a depth in the range of 2 to 15 microns.

The final step which is common with the bipolar processing is the formation of the N+ top gate and bottom gate contact regions 18 and 20, formed in the source and drain region 14 and the bottom gate 10, respectively and P+ source and drain contact regions 26 and 28 in source and drain regions 14 and 16, respectively. As illustrated in FIG. 3, an N+ top gate contact region 30 may also be formed in the source and drain region 16.

The N+ and P+ contact regions have a surface impurity concentrations in the range of $5 \times 10^{19}$ to $5 \times 10^{20}$. In order to increase the breakdown voltage of the top gate contact regions 18, 30 with the source and drain regions 14, 16, the top gate contact regions 18, 30 may have surface impurity concentration in the range of $5 \times 10^{17}$ to $5 \times 10^{19}$ along its length and one or more N+ regions of the range of $5 \times 10^{19}$ to $5 \times 10^{20}$ therein. This would increase the breakdown voltage from approximately 20 volts to approximately 55 volts. The contact regions 18, 20, 26, 28 and 30 have a depth in the range of 1 to 6 microns.

As will be explained more fully below, the N+ top gate contact regions 18 and 30 are formed so as to contact and extend along the termination edge of the to-be-formed top gate in the source and drain regions 16, 18. In FIGS. 2 and 3, the N+ top gate contact regions 18 and 30 are formed as annulus or closed geometry so as to completely encompass the to-be-formed top gate at its lateral edges. The P+ source and drain contact region 26 is also formed as an annulus concentric to and encompassing the N+ top gate contact annulus 18. The P+ source and drain contact region 28 is interior the annular N+ top gate contact region 30 as illustrated in FIG. 3. This produces four terminal isolated top gate devices. In FIG. 4, the top gate contact region 18 extends into the bottom gate region 10 to form a three terminal device.

By forming the top gate contact regions 18, 30 in the source and drain regions 14, 16, the top gate contact regions are isolated from the bottom gate 10 at the channel. This also allows the top gate contact regions 18, 30 to have sufficient horizontal and vertical dimensions to prevent metal contact migration into the source and drain regions 14, 16 which results in a short.

Next, the thin P channel region is formed by ion implanting P type impurities. The impurities are introduced to form a thin channel region below the surface having thickness in the range of 0.1 to 0.5 microns. The thin channel region overlaps portions of the source region 14 and the drain region 16 and may overlap positions of top gate contact regions 18 and 20. The P channel region 22 has a peak impurity concentration in the range of $1 \times 10^{16}$ to $1 \times 10^{18}$. This is less than the impurity concentration of the N+ top gate contact region 18 and 30 so that they do not adversely effect their resistance.

Next, N type impurities are ion implanted to form the top gate region 24 on top of the channel region 22. The top gate is formed to have a depth in the range of 0.05 to 0.4 microns and interconnects the source and drain regions 14 and 16 and the top gate contacts 18 and 30. The top gate region 24 has an impurity concentration in the range of $1 \times 10^{16}$ to $5 \times 10^{18}$. The surface impurity concentration of the source and drain regions 14 and 16 are selected to be less than that of the top gate region 24 such that during the ion implantation, the ions can change the conductivity type of portions of the surface of the source and drain regions 14 and 16 such that the top gate will contact and be connected to the top gate contacts 18 and 30.

A review of the structure of FIGS. 2 and 3 illustrate that the top gate 24 is separated from the bottom gate 10 on its lower surface by channel region 22 and source and drain regions 14 and 16. The lateral edges of the top gate 24 are encompassed by and contact the top gate contact regions 18 in FIGS. 2 and 18, 30 in FIG. 3. The contact regions 18, 30 have a higher impurity concentration than the top gate region 24 and may extend to a depth below the channel region 22. The top gate contact regions 18 and 30 are isolated from the bottom gate 10 by source and drain regions 14 and 16 respectively. The higher impurity concentration, and thus lower resistance, of the top gate contact regions 18, 30 substantially reduce the resistance of the thin ion implanted top gate 24. In larger geometry devices where the top gate 24 is substantially larger, this reduction is critical to increasing the time and frequency response of the device, as well as lowering its gate thermal resistance noise. The N+ contact region may be region 18 either at the outer edge in source and drain region 14, region 30 at the inner edge in source and drain region 16, or regions 18 and 30 at both.

Although the lower gate geometry improves speed and frequency response due to lower RC constants associated with the gate and improved noise performance associated with lower gate thermal noise, there is an accompanying disadvantage which must be taken into account. A pinched source and drain resistance $PP_c$ is introduced under the N+ contact regions 18, 30. For a process with a pinched resistance of 5,000 ohms per square, in a device with a 10 micron ring length and a 40 mil channel width, the pinched source and drain resistance would be 50 ohms.

If only the N+ top gate contact region 18 was formed in source and drain region 14 and this region is the drain, the 50 ohm resistance would be in series with the drain and would be negligible. If the source and drain region 14 were the source, the N+ contact region 18 and its associated 50 ohm resistance would act as a negative feedback element which would decrease the small signal transconductance gm. For a 40 mil channel width device having a gm without any top gate contact regions of 900 micro-mohs, the effective gm of an N+ top gate ring in the source region 14 would be gm ef=900 micro-mhos/(1+900 micro-mhos(50 ohms))=860 micro-mhos. This is approximately a reduction of gm of 4%.

If an isolated top to bottom gate is not desired, the structure of FIGS. 2 and 3 can also be applied to reduce the resistance of the top gate and a plurality of spoke-like N-type conductivity regions may be provided extended between the two top gate contact regions 18, 30 and extending down into the bottom gate region 10 through the top gate region 24 and the channel region 22. Although further reducing the gate resistance, it also reduces the channel area available. The structure of FIG. 4 is preferred for a non-isolated top gate or three terminal device.

The top gate contact regions 18 and 30 have been shown as continuous regions extending totally along the width of the top gate at its termination in the source and drain regions 14, 16. Although this structure maximizes the reduction of resistance, in some applications the top gate contact regions may extend only along a substantial portion of the edge termination in order to reduce capacitance. Also, the top gate contact regions 18, 30 may segmented so as to effectively extend completely along the edge termination.

Although the present invention has been described and illustrated in detail, it is to be clearly understood that the same is by way of illustration and example only, and is not to be taken by way of limitation. Although the present invention has been shown and applied to P channel devices, it may also be applied to N channel devices, reversing all the conductivity types. The spirit and scope of the present invention are to be limited only by the terms of the appended claims.

What is claimed:
1. A junction field effect transistor comprising:
a bottom gate region of a first conductivity type;
a source and a drain region of a second conductivity type spaced in said bottom gate,
a channel region of said second conductivity type in said bottom gate region and extending between said source and drain regions;
a top gate region of said first conductivity type on said channel region for extending between said source and drain regions and into at least one of said source and drains region, wherein it terminates at a first edge; and
a top gate contact region of said first conductivity type, having a lower resistance than said top gate region, and contacting said top gate region at said first edge in said one of said source and drain regions.

2. A junction field effect transistor according to claim 1, wherein said top gate contact region extends to a depth below said channel region.

3. A junction field effect transistor according to claim 1, wherein said top gate contact region extends along a substantial portion of said first edge.

4. A junction field effect transistor according to claim 1, wherein said one of said source and drain regions is a concentric region laterally encompassing the other of said source and drain regions which is an encompassed region; and said top gate contact region substantially laterally encompasses said first edge.

5. A junction field effect transistor according to claim 4, including a concentric region contact region of said second conductivity type, in said concentric region, and spaced from and laterally encompassing said top gate contact region.

6. A junction field effect transistor according to claim 5, including a bottom gate contact region of said first conductivity type in said bottom gate region and exterior said concentric region.

7. A junction field effect transistor according to claim 4, wherein said concentric region is said drain region and said encompassed region is said source region.

8. A junction field effect transistor according to claim 1:
wherein said top gate region extends into the other of said source and drain regions and terminates at a second edge therein; and
including another top gate contact region of said first conductivity type having a lower resistance than said top gate region and contacting said top gate region at said second edge in said other of said source and drain regions.

9. A junction field effect transistor according to claim 8, wherein said top gate contact regions extend to a depth below said channel region.

10. A junction field effect transistor according to claim 8, wherein said source, drain and channel regions are of a depth sufficient to isolate said top gate and top gate contact regions from said bottom gate region.

11. A junction field effect transistor according to claim 1, wherein said source, drain and channel regions are of a depth sufficient to isolate said top gate and top gate contact regions from said bottom gate region.

12. A junction field effect transistor according to claim 1, wherein said top gate region has a thickness in the range of 0.05 to 0.4 microns and said channel region has a thickness in the range of 0.1 to 0.5 microns.

13. A junction field effect transistor according to claim 1, wherein said top gate contact region extends from said first edge and said one of said source and drain regions into said bottom gate region.

* * * * *